United States Patent [19]

Bonora et al.

[11] Patent Number: 4,995,430

[45] Date of Patent: Feb. 26, 1991

[54] SEALABLE TRANSPORTABLE CONTAINER HAVING IMPROVED LATCH MECHANISM

[75] Inventors: Anthony C. Bonora, Menlo Park; Frederick T. Rosenquist, Redwood City, both of Calif.

[73] Assignee: Asyst Technologies, Inc., Milpitas, Calif.

[21] Appl. No.: 354,027

[22] Filed: May 19, 1989

[51] Int. Cl.$^5$ .......................... B65B 1/04; B05G 65/00
[52] U.S. Cl. ........................................ 141/98; 141/85; 141/383; 414/217; 414/292
[58] Field of Search ................... 141/98, 383–386, 141/319–323, 346, 85; 414/217, 292, 221

[56] References Cited

U.S. PATENT DOCUMENTS

| | | | |
|---|---|---|---|
| 539,925 | 5/1895 | Swan | 220/323 X |
| 3,260,381 | 7/1966 | Wagnes et al. | 414/292 |
| 4,132,327 | 1/1979 | Van DYke et al. | 220/323 X |
| 4,260,312 | 4/1981 | Hackney | 414/292 |
| 4,532,970 | 8/1985 | Tullis et al. | 141/98 |
| 4,534,389 | 8/1985 | Tullis | 141/98 |
| 4,616,683 | 10/1986 | Tullis et al. | 141/98 |
| 4,674,936 | 6/1987 | Bonora | 414/217 |
| 4,674,939 | 6/1987 | Maney et al. | 414/292 |
| 4,676,709 | 6/1987 | Bonora et al. | 414/217 |
| 4,705,444 | 11/1987 | Tullis et al. | 414/226 |
| 4,724,874 | 2/1988 | Parikh et al. | 141/98 |
| 4,739,882 | 4/1988 | Parikh et al. | 141/98 X |
| 4,815,912 | 3/1989 | Maney et al. | 414/217 |

Primary Examiner—Ernest G. Cusick
Attorney, Agent, or Firm—Fliesler, Dubb, Meyer and Lovejoy

[57] ABSTRACT

A transportable, sealable container, for example a SMIF pod, has a box and a box door. The box has a first sealing surface and the box door has a second sealing surface which forms a seal with the first sealing surface when the box door is moved in a sealing direction with respect to the box. A latch mechanism provided in the box door is operable in two stages. The first stage of operation moves latch members from a retracted position to an extended position, in the retracted position the latch members are contained in the box door to allow movement of the box door with respect to the box, and in the extended position the latch members are adjacent to latch surfaces of the box. Movement from the retracted to the extended position is performed without contact between the latch members and the latch surfaces to avoid any scraping or rubbing action which would create particles in the "clean" interior region of the box. The second stage of operation engages latch members with the latch surfaces to move the box door in the sealing direction; this second stage of the operation is also performed without scraping or rubbing of the latch members and the latch surfaces.

12 Claims, 12 Drawing Sheets

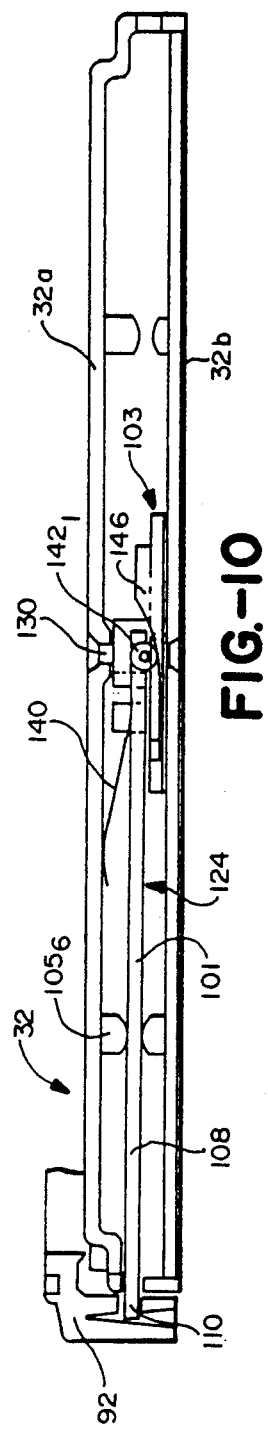
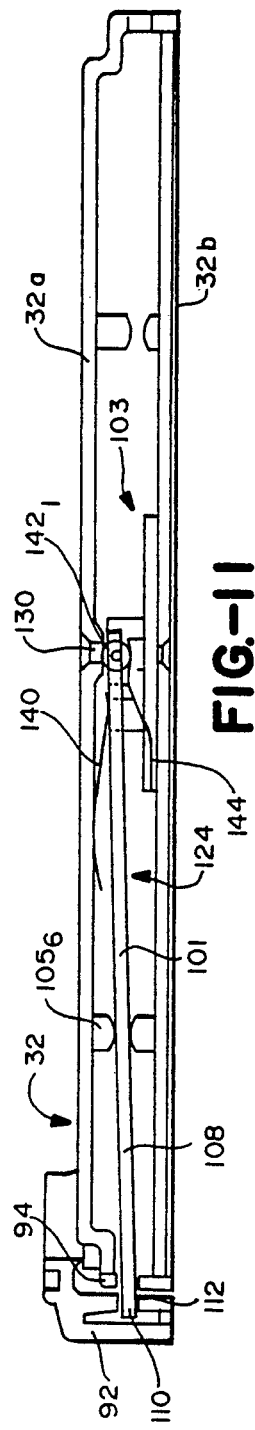
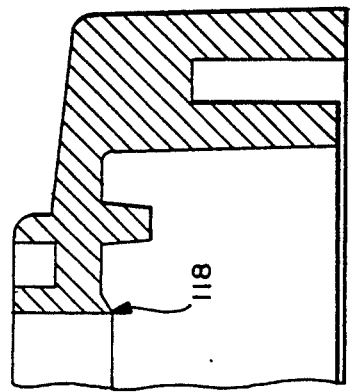
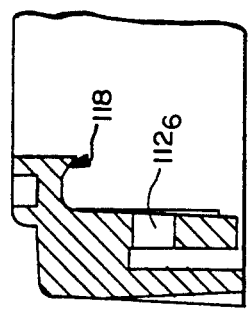

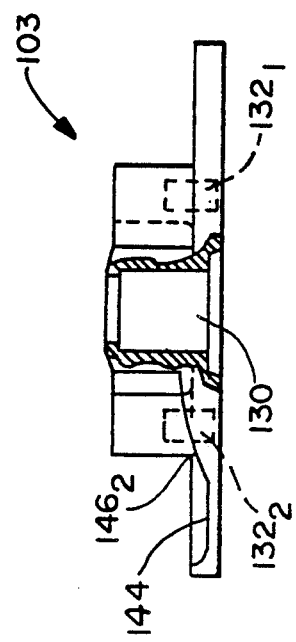
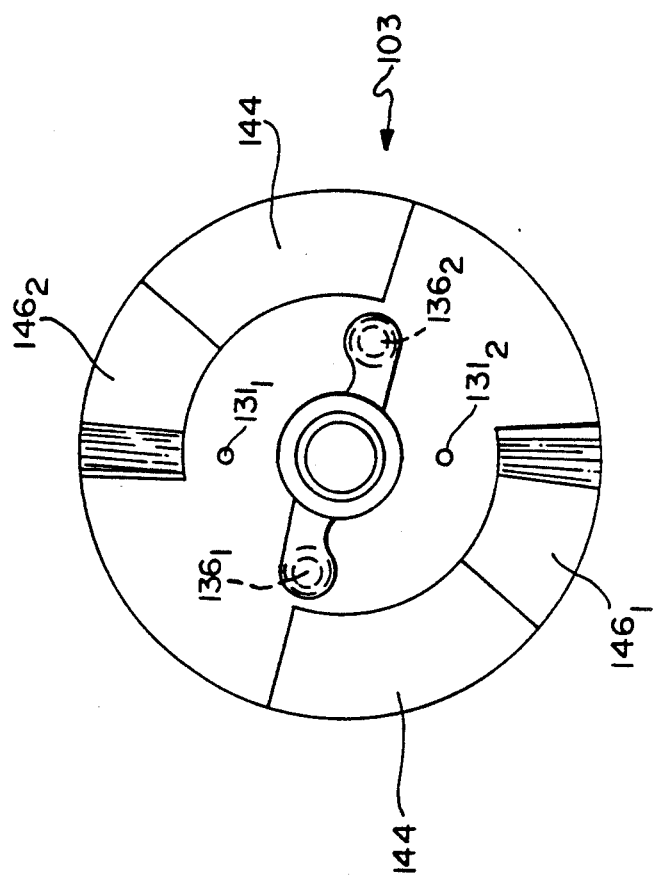

SEALABLE TRANSPORTABLE CONTAINER HAVING IMPROVED LATCH MECHANISM

CROSS-REFERENCE TO RELATED APPLICATIONS

This Application is related to the following Applications/Patents, all assigned to the assignee of the subject Application:

SEALED STANDARD INTERFACE APPARATUS, Inventors: George Allen Maney, Andrew William O'Sullivan, W. George Faraco, Ser. No. 635,384, Filed: July 30, 1984, now U.S. Pat. No. 4,674,939;

INTELLIGENT WAFER CARRIER, Inventors: George Allen Maney, Anthony Charles Bonora, Mihir Parikh, Ser. No. 686,444, Filed: Dec. 24, 1984, now U.S. Pat. No. 4,674,939;

DOOR ACTIVATED RETAINER, Inventors: George Allen Maney, W. George Faraco, Mihir Parikh, Ser. No. 686,443, Filed: Dec. 24, 1984, now U.S. Pat. No. 4,815,912;

LONG ARM MANIPULATOR FOR STANDARD MECHANICAL INTERFACE APPARATUS, Inventors: Anthony Charles Bonora, Andrew William O'Sullivan, Ser. No. 769,709, Filed: Aug. 26, 1985, now U.S. Pat. No. 4,676,709;

SHORT ARM MANIPULATOR FOR STANDARD MECHANICAL INTERFACE APPARATUS, Inventors: Anthony Charles Bonora, Ser. No. 769,850, Filed: Aug. 26, 1985, now U.S. Pat. No. 4,674,936;

CONTAINER HAVING DISPOSABLE LINERS, Inventors: Mihir Parikh, Anthony Charles Bonora, W. George Faraco, Barney H. Huang, Ser. No. 829,447, Filed: Feb. 13, 1986, now U.S. Pat. No. 4,739,882; and SEALABLE TRANSPORTABLE CONTAINER HAVING A PARTICLE FILTERING SYSTEM, Inventors: Mihir Parikh, Anthony C. U.S. Pat. No. 4,724,874.

BACKGROUND OF THE INVENTION

1. Field of the Invention

The present invention relates to standardized mechanical interface (SMIF) systems for reducing particle contamination, and more particularly to transportable containers which are sealable to prevent influence of external factors on the contents of the containers.

2. Description of the Related Art

A standardized mechanical interface (SMIF) system has been proposed by the Hewlett-Packard Company as disclosed in U.S. Pat. Nos. 4,532,970 and 4,534,389. The purpose of the SMIF system is to reduce particle fluxes onto wafers. This end is accomplished, in part, by mechanically ensuring that during transportation and storage the gaseous media (such as air or nitrogen) surrounding the wafers is essentially stationary relative to the wafers and by ensuring that particles from the ambient environment do not enter the immediate wafer environment. The SMIF concept is based on the realization that a small volume of controlled (with respect to motion, air flow direction and external contaminants), particle-free air provides a clean environment for wafers. Further details of one proposed system are described in the article entitled "SMIF: A TECHNOLOGY FOR WAFER CASSETTE TRANSFER IN VLSI MANUFACTURING," by Mihir Parikh and Ulrich Kaempf, *Solid State Technology*, July 1984, pp. 111-115.

Systems of the above type are concerned with particle sizes which range from below 0.1 micrometers to above 200 micrometers. Particles with these sizes can be very damaging in semiconductor processing because of the small geometries employed in fabricating semiconductor devices. Typical advanced semiconductor processes today employ geometries which are 1 micrometer and under. Unwanted contamination particles which have geometries measuring greater than 0.05 micrometers substantially interfere with 1 micrometer geometry semiconductor devices. The trend, of course, is to have smaller and smaller semiconductor processing geometries which today in research and development labs approach 0.5 micrometers and below. In the future, geometries will become smaller and smaller and hence smaller and smaller contamination particles become of interest.

A SMIF system has three main components: (1) minimum volume, sealed pods used for storing and transporting wafer cassettes; (2) canopies placed over cassette ports and wafer processing areas of processing equipment so that the environments inside the pods and canopies (after having clean air sources) become miniature clean spaces; and (3) a transfer mechanism to load-/unload wafer cassettes from a sealed pod without contamination of the wafers in the wafer cassette from external environments.

Wafers are stored and transported in pods, and are transferred from a pod to a piece of processing equipment in the following manner. First, a pod is placed at the interface port on top of the canopy. Each pod includes a box and a box door designed to mate with doors on the interface ports of the processing equipment canopies. Then, latches release the box door and the canopy port door simultaneously; the box door and the interface port door are opened simultaneously so that particles which may have been on the external door surfaces are trapped ("sandwiched") between the box and interface port doors. A mechanical elevator lowers the two doors, with the cassette riding on top, into the canopy covered space. A manipulator picks up the cassette and places it onto the cassette port/elevator of the equipment. After processing, the reverse operation takes place.

The SMIF system has been proved effective by experiments using prototype SMIF components both inside and outside a clean room. The SMIF system provides at least a ten-fold improvement over the conventional handling of open cassettes inside the clean room.

Conventional SMIF pods have the potential to create particles due to physical scraping of latch mechanisms against latch surfaces. Although few particles are released during each latching operation, over the course of hundreds of processing steps for a wafer, the number of particles created each time the SMIF pod is latched and/or unlatched may build to a significant number.

In SMIF pods utilizing conventional latching systems, scraping occurs when a latch member and a latch surface, one or both of which have a sloped surface, move from a disengaged to a fully engaged orientation. The sealing surfaces on the box and the box door are designed to seal upon application of pressure which forces these sealing surfaces together, and thus the latch system must (a) prevent movement of the box door with respect to the box and (b) create a clamping force which forces the sealing surfaces together. The clamping force is generated by sliding the latch surface along a sloped latch member or vice versa.

Latch mechanisms on conventional SMIF pods are usually provided on the box so that the latch mechanism may alternately be used to clamp the box door to the box or to clamp the box to the port plate of a processing station. To provide this dual function, it is necessary to have notches or openings in the perimeter of the bottom of the box so that the latch mechanisms could move to engage either the box door or the port plate. These openings provide access points through which contaminants may enter the "clean" environment.

In conventional SMIF pods, the latch mechanism supports the edges of the box door creating the possibility that the box door will deflect (bow or bend) under the weight of the wafers resting on the box door in addition to the sealing forces, potentially creating leaks in the seal between the box and the box door. Further, conventional latch mechanisms for SMIF pods may be subject to tampering which allows unauthorized access to the contents of the container.

SUMMARY OF THE INVENTION

It is, therefore, an object of the present invention to provide a sealable, transportable container having a latch mechanism which operates without any scraping or rubbing contact of the latch mechanism and portions of the container contacted by the latch mechanism.

A further object of the present invention is to provide a latch mechanism which supports the box door at positions which minimize deflection (or bowing) of the box door.

Another object of the present invention is to provide a transportable container in which the latch mechanism is tamper resistant to prevent unauthorized access to the contents of the container.

Another object of the present invention is to provide a SMIF pod having a latch mechanism which is centrally operated.

These and other objects of the present invention are provided by a latch mechanism which has motion in two directions and which moves in both directions without making scraping or rubbing contact with the box or box door in the clean, interior region of the box. The first direction of motion moves the latch mechanism from a first retracted or bypass position, where the box and box door are free to move with respect to each other so that the pod may be opened or closed, to a second or extended position, Where the latch mechanism prevents the box door from moving with respect to the box. The sealing surfaces of the box and the box door make sealable contact when the box door is moved in a sealing direction so that the sealing surface of the box door moves towards and contacts the sealing surface of the box. The second direction of motion of the latch mechanism is such that the latch mechanism moves the box door in the sealing direction with respect to the box. Further, the latch mechanism supports the box door at points spaced from the periphery of the box door.

A sealable, transportable container in accordance with the present invention comprises a box having a first sealing surface, a box door having a second sealing surface adapted to form a seal with said first sealing surface when said box door is moved in a sealing direction with respect to said box, and latch means for motion in a first direction between a first position which allows motion of said box door with respect to said box, and a second position, which allows motion of said box door with respect to said box, and a second position, which limits the motion of said box door with respect to said box, without scraping contact between said latch means and said box or said box door in said interior region, and for motion in a second direction between said second position and a third position to move said box door in the sealing direction to bring said first and second sealing surfaces into contact without scraping contact between said latch means and said box or said box door in said interior region.

A standardized mechanical interface (SMIF) pod in accordance with the present invention comprises a box having an interior region, a first sealing surface, and at least two latch engaging surfaces; a box door having a second sealing surface which sealably mates with said first sealing surface when said box door is moved in a sealing direction with respect to said box to isolate said interior region from ambient pressure conditions; a latch member provided in said box door, having at least two box engagement portions, and being movable between a disengaged position, an engaging position and an engaged position, whereby the latch member is adapted to move from the disengaged position to the engaging position without contacting said box and whereby movement of said latch member from the engaging position to the engaged position causes said box engagement portions of said latch member to contact said latch engaging surfaces without scraping said latch member against said latch engaging surfaces and to move said box door in the sealing direction; and two-stage cam means for moving said latch member from the disengaged position to the engaging position in a first independent stage of operation and for moving said latch plate from the engaging position to the engaged position in a second independent stage of operation.

These and other objects and advantages of the invention will appear more clearly from the following description in which the preferred embodiments of the invention have been set forth in detail in conjunction with the drawings.

BRIEF DESCRIPTION OF THE DRAWINGS

FIG. 8B is a sectional view along line 8B—8B in FIG. 8A;

FIG. 8C is a sectional view along line 8C—8C in FIG. 8A;

FIGS. 10 and 11 are side views showing the latch mechanism of the present invention in the second position and a third position, respectively;

FIG. 12 is a plan view of the two-stage rotary cam;

FIG. 13 is a side view of the two-stage rotary cam;

DESCRIPTION OF THE PREFERRED EMBODIMENTS

The present invention will be described in the context of a SMIF system for storing and transporting wafers and/or reticles. However, it is to be understood that a sealable, transportable container in accordance with the present invention may be used to store and transport many other inanimate objects as well as living objects such as laboratory animals.

The general structure of a SMIF pod and the mating of a SMIF pod with processing equipment are described in U.S. Pat. No. 4,724,874 which is hereby incorporated by reference. However, for completeness, a brief description of the disclosure is provided herein.

Figure 1A:
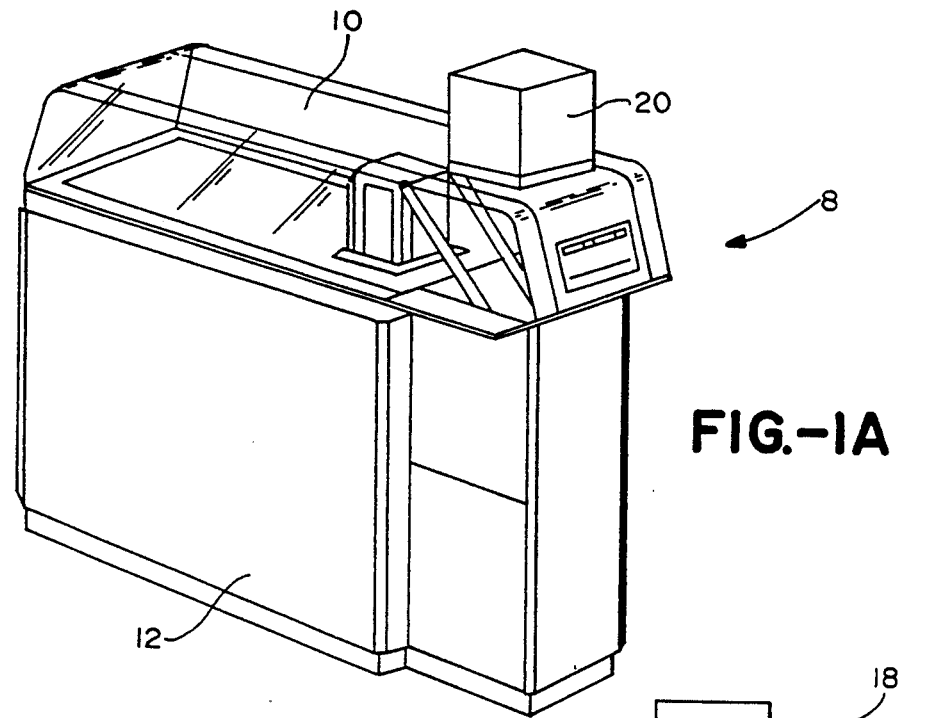
FIG. 1A is an isometric view of a processing station having a canopy for receiving a SMIF pod.

FIGS. 1 and 2 illustrate a processing station 8 having a canopy 10 which is an easily removable shield that covers the wafer handing mechanism of processing equipment 12. Equipment 12 may be, for example, a photo resist applicator, mask aligner, inspection station or any similar processing equipment. The canopy 10, which is constructed of transparent plastic such as acrylic or Lexan to facilitate visual inspection and/or maintenance within the canopy 10, encloses the handling mechanisms of the processing equipment 12 and a holder 14, such as a wafer cassette holding wafers 6. The environment within the processing equipment is separately maintained and separately cleaned and therefore the equipment 12 need not be installed in a clean room.

Figure 1B:
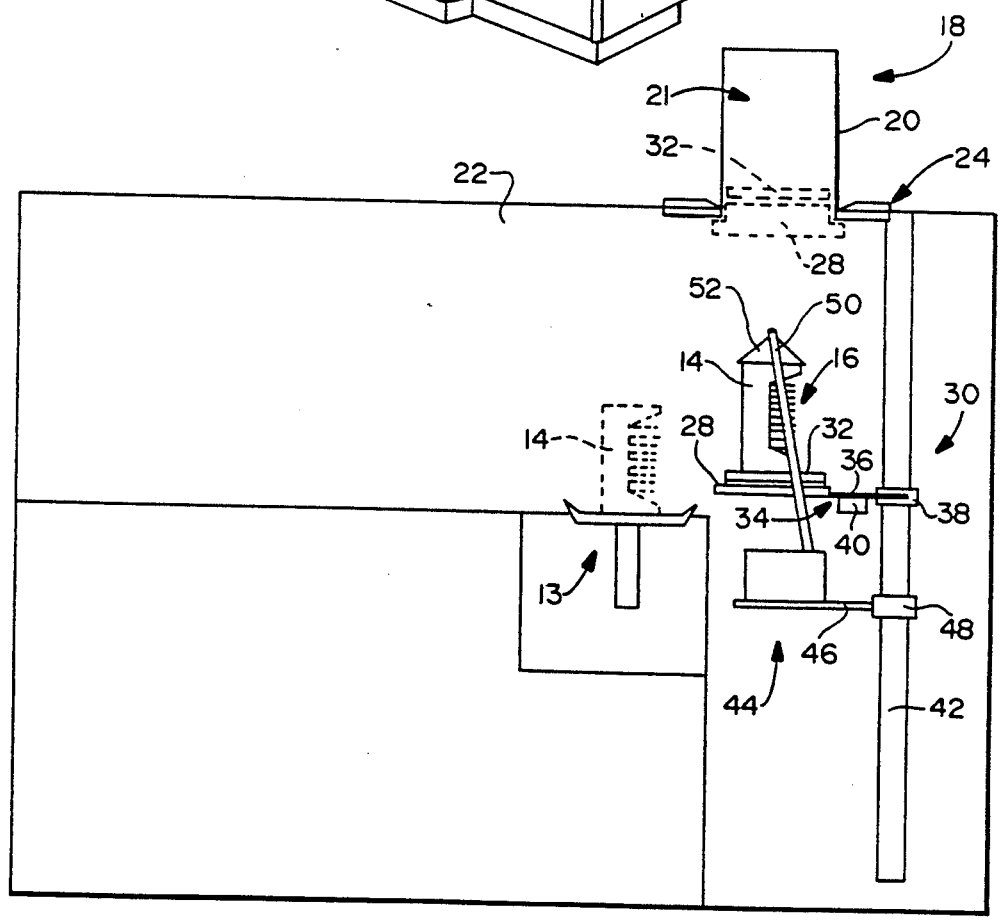
FIG. 1B is a cutaway side view of the processing station of FIG. 1.

A sealable, transportable container (or pod) 18 having a box (or box top) 20 having an interior region 21 and a box door 32 is mounted on the horizontal surface 22 of canopy 10 by a port assembly 24. The port assembly 24 includes a port plate 26, port door 28, and an elevator assembly 30. Elevator assembly 30 transports a cassette holder 14, containing the integrated circuit wafers 16 from the interior region 21 of box 20 into the region beneath the canopy 10. In FIG. 1B, port door 28 and box door 32 are shown in the closed position by the dotted lines. A mover assembly 34 includes a platform 36, a shaft engagement device 38 and a drive motor 40. The platform 36, extending from the elevator assembly 30, carries the port door 28, the box door 32 and the holder 14 in a vertical direction. The platform 36 is attached by engagement device 38 to a vertical guide 42 of elevator assembly 30.

Typically, guide 42 includes a lead screw (not shown) and the drive motor 40 drives a gear (not shown) which engages the lead screw for driving the platform 36 up or down. When the platform 36 is driven to the closed position, the port door 2B closes the port opening in the canopy 10.

In a similar manner, a manipulator assembly shown generally by the numeral 44 is fastened to a platform 46 which has an engagement means 48 for engaging the vertical guide 42. Manipulator assembly 44 includes a manipulator arm 50 and an engagement head 52 adapted to engage holder 14. By vertical operation of the platforms 36 and 46 and by operation of the manipulator assembly 44, the holder 14 is moved from its position on the box door 32 to a position on the equipment station 13 (as shown by the broken lines).

Figure 2A:
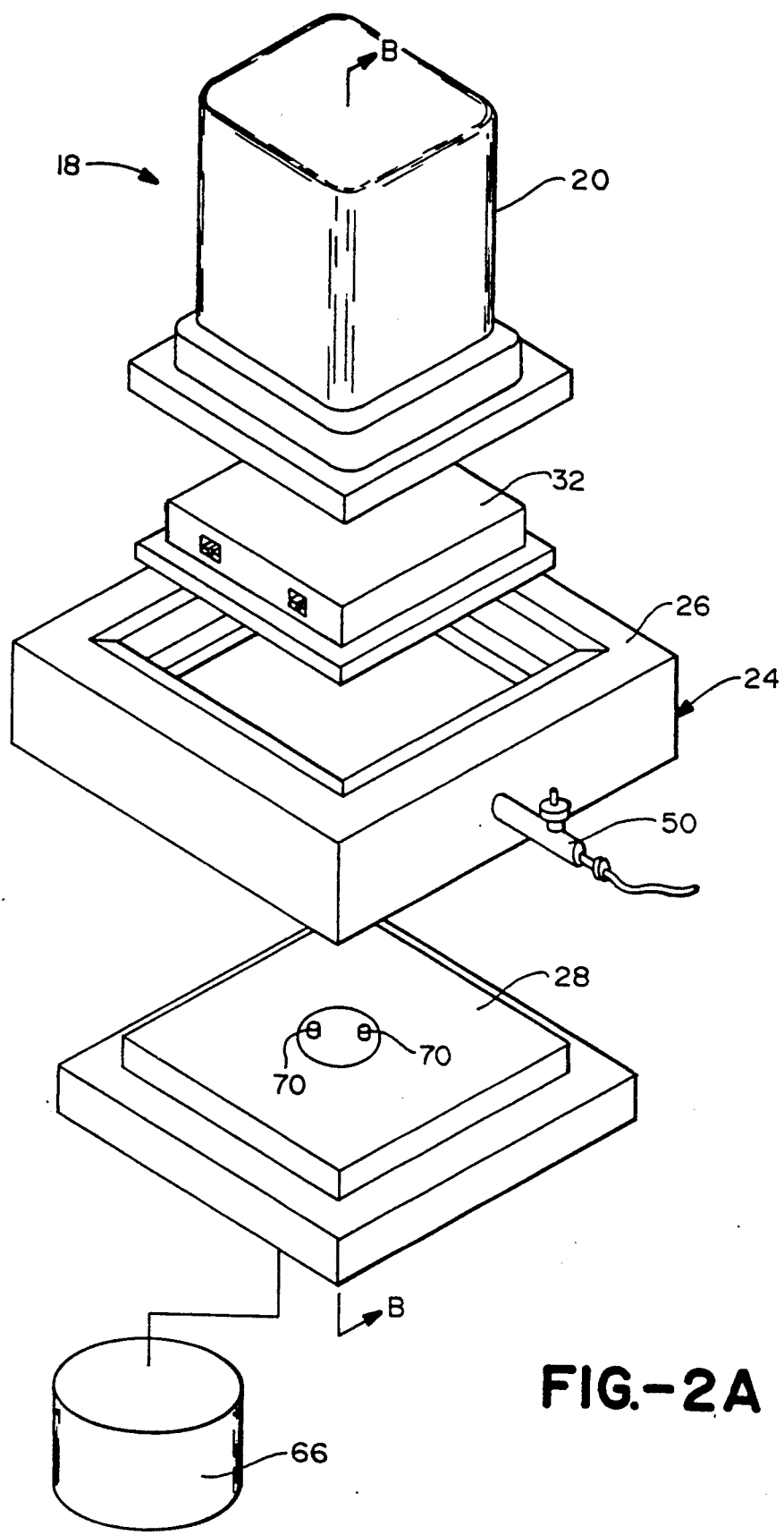
FIG. 2A is an isometric view of a SMIF pod and portions of a port assembly for receiving the SMIF pod.

FIG. 2A is an exploded view of container 18 and port assembly 24. Container 18 can be alternately pressurized or evacuated when box 21 and box door 32 are sealed together to isolate the interior region of box 21 from ambient conditions. Port plate 26 is connectable to a coaxial injector/extractor 50 at gas transfer valve 52 (FIG. 2B).

Figure 2B:
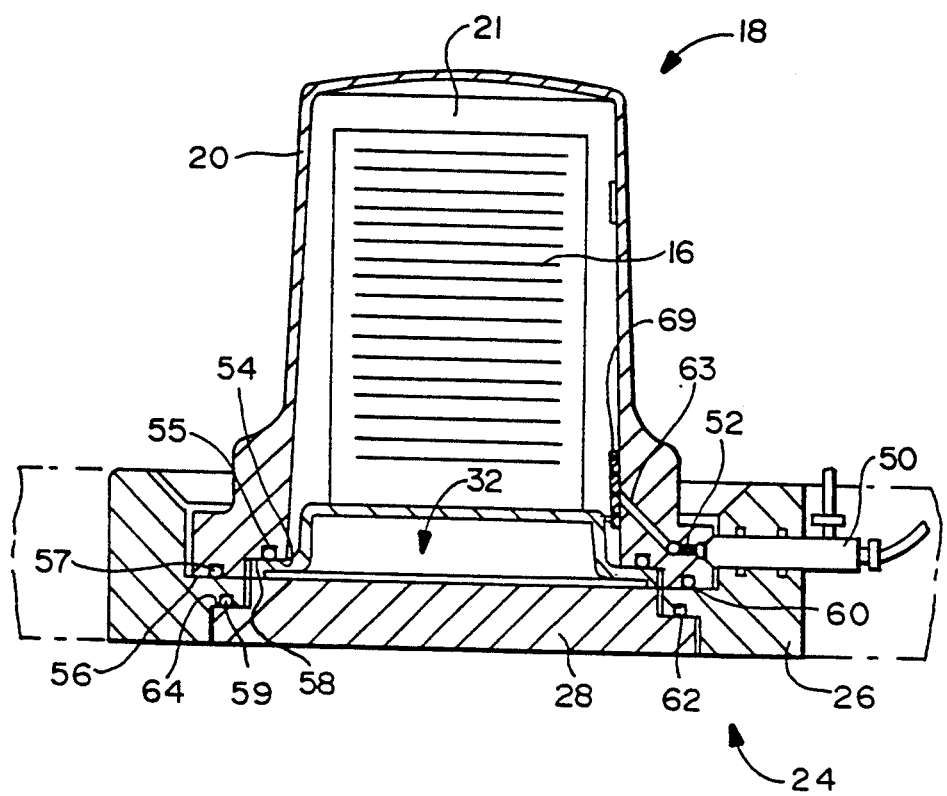
FIG. 2B is a sectional view along line B—B of FIG. 2A.

FIG. 2B shows container 18 mated to port assembly 24 of processing equipment 12. Container 18 is designed for sealably mating with the port assembly 24, and thus box 20 has first and second box top sealing surfaces 54, 56, respectively. Box door 32 has a first box door sealing surface 58 for sealably mating with the first box top sealing surface 54, and gasket 55 between surfaces 54 and 58 provides a seal. Port plate 26 has first and second port plate sealing surfaces 60, 62, respectively. The first port plate sealing surface 60 sealably mates with the second box top sealing surface 56, making a second seal as gasket 57 is compressed.

Port door 28 has a first port door sealing surface 64 which sealably mates with the second port plate sealing surface 62; a third seal is provided by gasket 59. The box top 20 may include a conduit 63 defining a channel between valve 52 and the interior space 21 of box 20. At one end of channel 66 is a filter 69 for filtering fluids (e.g., gasses) passing therethrough.

When the first, second and third seals are made, the interior space 21 of box 20 may cleaned by alternately evacuating/pressurizing the interior space 21. In order to evacuate interior space 21, injection/extractor 50 is activated to withdraw fluid from interior space 21. As the fluids are withdrawn, they pass through filter 69, through channel 66 and through a coaxial valve (not shown) of injection/extractor 50.

The port door 28 includes a latch actuating mechanism 66 having pins 70 for actuating the box door latch mechanism 80 and thereby releasing box door 32 from box 20. Wafers 16 can be moved by elevator mechanism 30 and mover assembly 34 into the proper position in the processing equipment 12 for processing without human intervention.

A latch mechanism for a SMIF pod in accordance with the present invention will be described with reference to FIGS. 3-13. In the preferred embodiment, the latch mechanism is provided in box door 32 and centrally actuated, allowing a single latch actuating mechanism to r ⓡlease the box door 32 from the box 20. Alternatively, a latch mechanism in accordance with the present invention could be provided in box 20.

Figure 3:
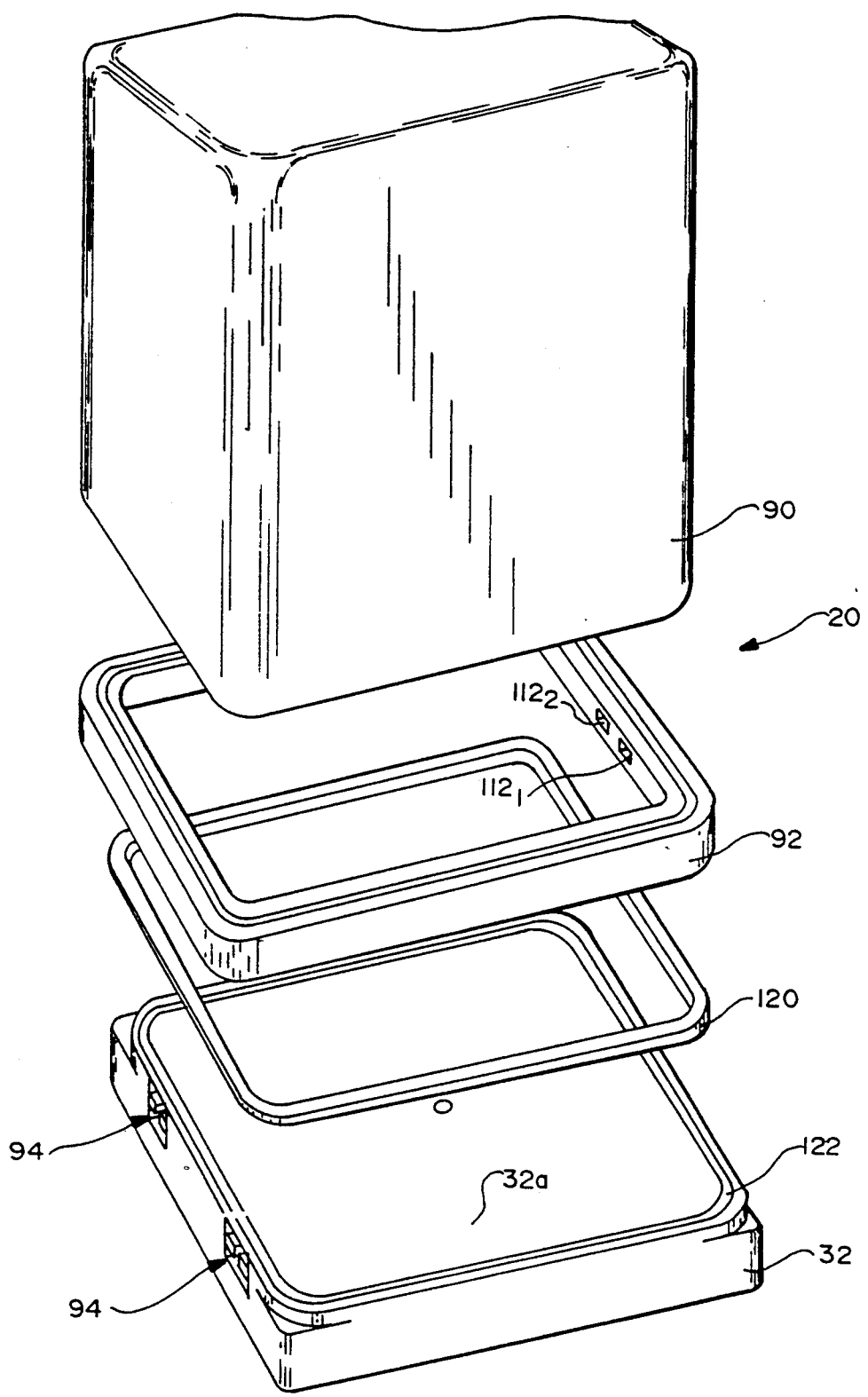
FIG. 3 is an isometric, exploded view of a SMIF pod in accordance with the present invention.
Figure 4:
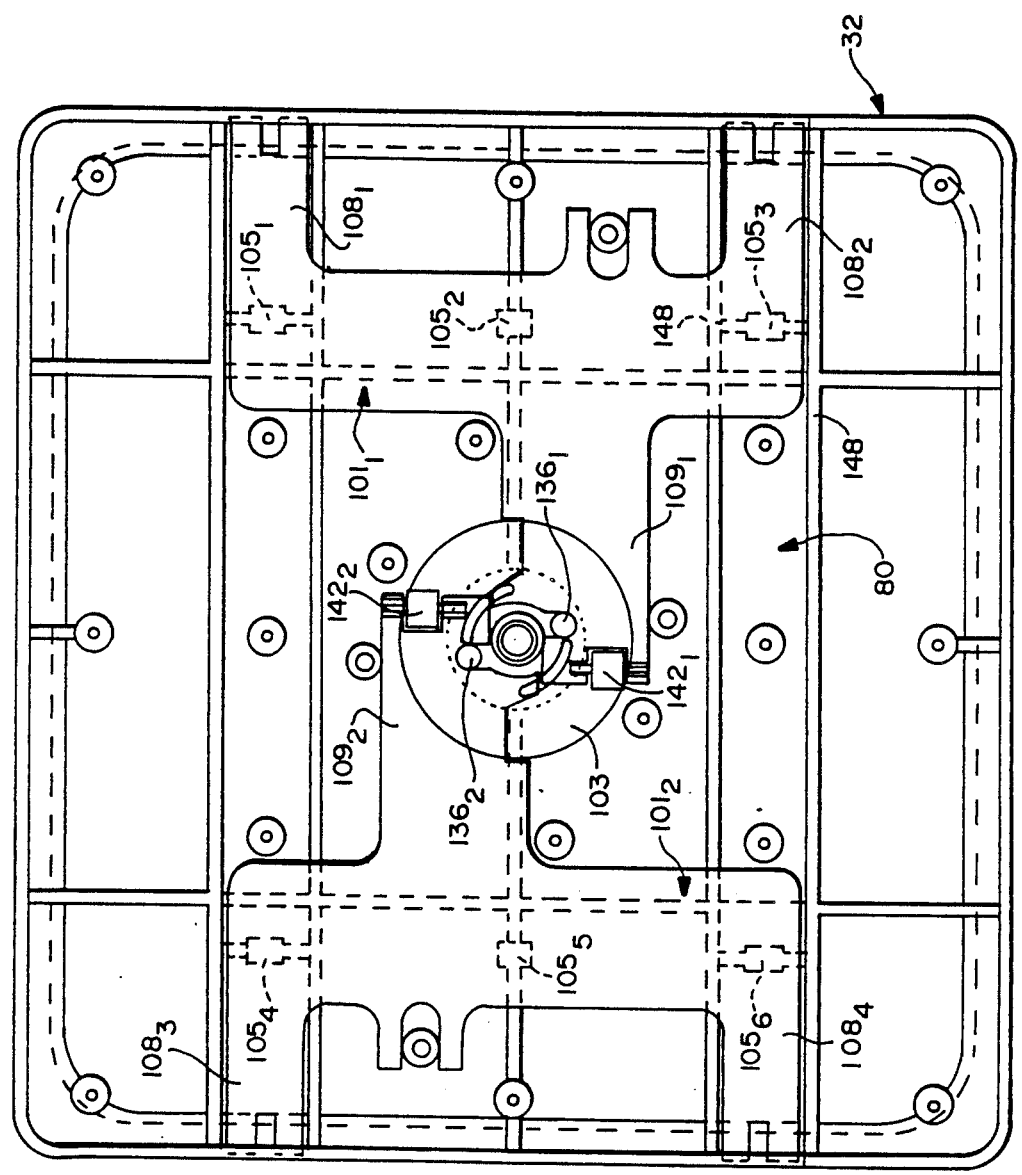
FIGS. 4 and 5 are plan views of a latch mechanism in accordance with the present invention in first and second positions, respectively.

With reference to FIG. 3, box 20 includes a domed housing 90 and a ring-like engaging portion 92. Housing 90 and engaging portion 92 may be formed integrally, for example, by injection molding, or as separate components assembled to form box 20. A gasket 120, which provides the seal between box 20 and box door 32 resides in a gasket-retaining slot 122 in box door 32. In the preferred embodiment, a liner (not shown) is provided on door 32 and gasket 120 contacts the liner. The liner is a removable element which may be formed of, for example, plastic materials which do not outgas or introduce particles, as described in U.S. Pat. No. 4,739,882, which is hereby incorporated by reference. The liner may also be formed of a material which provides the capability of dissipating or preventing the formation of static charges. Latch mechanism 80 is housed in base and latch mechanism 80 protrudes from box door 32 through windows 94 to engage latch engaging surfaces $112_{1-8}$ (FIGS. 8-9) of box 20.

The two-stage rotary cam latch mechanism 80 of the present invention includes first and second latch plates $101_{1-2}$, a cam mechanism 103 pivotally mounted on box door 32, and latch plate supports $105_{1-6}$. The operation of latch mechanism 80 is a two-stage operation which is illustrated in FIGS. 4-7 and 10-11. In the first stage of operation, cam mechanism 103 slides latch plates $101_{1-2}$ linearly, and in the second stage, cam mechanism 103 causes latch plates $101_{1-2}$ to pivot on latch plate supports $105_{1-6}$.

Each latch plate $101_{1-2}$ has at least one box-engaging portion; in the preferred embodiment of the present invention, designed for use in a pod for storing and transporting 200mm wafers, each latch plate $101_{1-2}$ has two latch arms $108_{1-2}$ and $108_{3-4}$, respectively. Latch arms $108_{1-4}$ each have two latch fingers $110_{1-8}$ which engage respective ones of latch engaging surfaces $112_{1-8}$ of box 20.

The first stage of the latching operation involves moving latch plates $101_{1-2}$ from retracted (or disengaged) positions (FIG. 4) where the latch plates $101_{1-2}$ are entirely contained within box door 32 to extended (or engaging) positions (FIG. 5) where latch fingers $110_{1-8}$ extend out of box door 32 and are adjacent to latch engaging surfaces $112_{1-8}$ of box 20. In the first stage when the latch plates $101_{1-2}$ move from the retracted position to the extended position in a plane parallel to the plane of box door 32, latch fingers $110_{1-8}$ do not contact latch engaging surfaces $112_{1-8}$. Accordingly, there are no particles created by scraping or rubbing of the latch fingers $110_{1-8}$ against the latch engaging surfaces $112_{1-8}$.

Figure 8A:
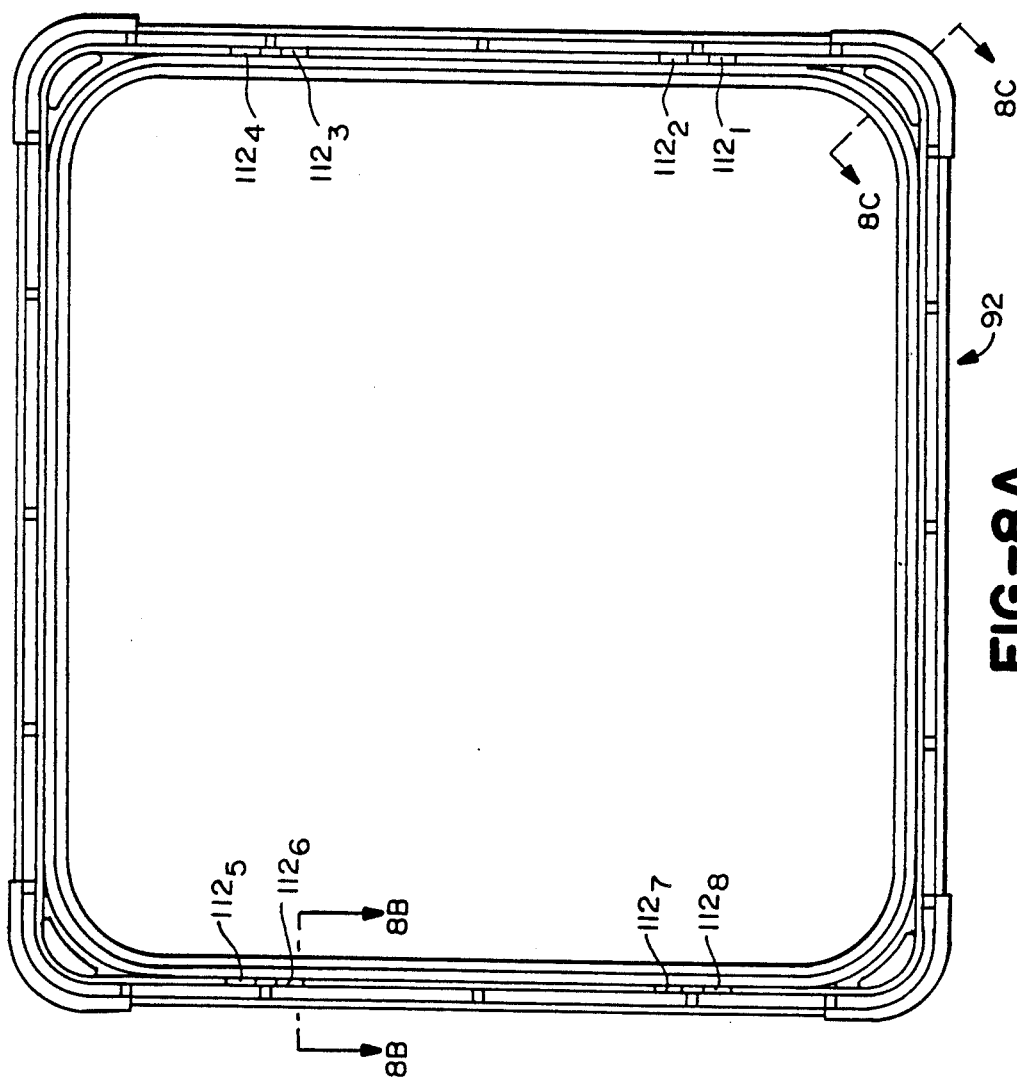
FIG. 8A is a plan view of an interface portion of a SMIF pod box which interacts with the latch mechanism of the present invention.

The second stage of the latching operation involves substantially vertical motion of latch fingers $110_{1-8}$. "Vertical motion" refers to motion in a direction perpendicular to the plane of box door 32, and to the plane of motion of latch plates $101_{1-2}$ during the first stage of the latching operation. The motion of latch fingers $110_{1-8}$ during the second stage engages latch fingers $110_{1-8}$ with respective ones of latch engaging surfaces $112_{1-8}$, and creates a latching and/or clamping force which sealably mates a first sealing surface of box 20 with second sealing surface of box door 32. The first sealing surface comprises knife edge 118 on box 20, and the second sealing surface comprises gasket-retaining slot 122 in box door 32. A gasket 120 sits in gasket-retaining slot 122 and forms the seal between box 20 and box door 32. Gasket 120 is preferably fabricated from a resilient, compressible material which does not release particles when contacted and compressed by knife edge 118 or outgas. FIG. 8A illustrates engaging portion 92 of box 20 in a plan view and FIGS. 8B and 8C illustrate knife edge 118 in cross section. As discussed above, a liner may be provided between box door 32 and gasket 120.

Latch mechanism 80 resides in a cavity 124 in box door 32. Accordingly, any particles generated by the interaction of cam mechanism 103 and latch plates $101_{1-2}$ and/or latch plates $101_{1-2}$ and latch plate supports $105_{1-6}$ are contained in cavity 124. Additionally, it is possible to add a port in box door 32 so that cavity 124 may be evacuated in order to remove any particles which are created in cavity 124.

The details of the construction and operation of cam mechanism 103 will be described with reference to FIGS. 6, 7, 10, 11, 12 and 13. Cam mechanism 103 is a two-stage cam mounted on a pivot post 130 (FIGS. 10-11); pivot post 130 is attached to the top surface 32a of box door 32. First and second holes $132_{1-2}$ in cam mechanism 103 engage pins 70 of latch actuating mechanism 66. First and second slots $134_{1-2}$ are provided in bottom wall 32b of box door 32 to enable pins 70 to engage cam holes $132_{1-2}$.

The two stages of operation of cam mechanism 103 and latch plates $101_{1-2}$ occur as follows. In the first phase of the latching operation, cam lobes $136_{1-2}$ engage camming surfaces $138_{1-2}$ (FIGS. 6-7), respectively of latch plates $101_{1-2}$. As cam mechanism 103 rotates through an angle of approximately 40° from an unlatched to an intermediate position, cam lobes $136_{1-2}$ cause latch plates $101_{1-2}$ to move from the retracted to the extended position. In order to maintain latch plates $101_{1-2}$ in a plane parallel to the plane of box door 32 during the sliding operation of the first stage of the latching operation, latch plate springs $140_{1-2}$ (FIGS. 10-11) are attached to respective ones of latch plates $101_{1-2}$ and force the cam arms $109_{1-2}$ of respective ones of latch plates $101_{1-2}$ towards cam mechanism 103. The biasing force provided by springs 140 (FIGS. 10-11) causes rollers $142_{1-2}$ of respective ones of latch plates $101_{1-2}$ to contact roller surface 144 of cam mechanism 103.

Risers $146_{1-2}$ (FIGS. 10-13) are provided on roller surface 144 of cam mechanism 103. As cam mechanism 103 rotates beyond the first 40° of motion from the intermediate position to a latched position, linear motion of latch plates $101_{1-2}$ ceases and rollers $142_{1-2}$ begin riding up respective ones of risers $146_{1-2}$. As rollers $142_{1-2}$ ride up risers $146_{1-2}$, latch plates $101_{1-2}$ pivot about an axis defined by the contact points of latch plate $101_1$ and a first group of latch plate supports $105_{1-3}$ and of latch plate $101_2$ and a second group of latch plate supports $105_{4-6}$. The pivoting motion of latch plates $101_{1-2}$ causes latch fingers $110_{1-8}$ to move substantially vertically without scraping motion of latch fingers 110 and latch surfaces $112_{1-8}$. For the latch mechanism of the present invention, where latch plate supports $105_{1-6}$ are approximately 2¼" from fingers 110 when the latch plates $101_{1-2}$ are in the intermediate position and move vertically approximately 0.054" from the intermediate to the latched position, experimental results have shown that latch fingers 110 undergo horizontal motion of only approximately 0.001". This minimal amount of horizontal motion prevents generation of particles by scraping.

In the unlatching operation rollers $142_{1-2}$ ride back down risers $146_{1-2}$ as cam mechanism 103 is rotated in the opposite direction. Springs $140_{1-2}$ provide the biasing force to keep rollers $142_{1-2}$ in contact with risers $146_{1-2}$. After rollers 140 come in contact with roller surface 144, cam lobes $136_{1-2}$ engage cam surfaces $138_{1-2}$ of latch plates $101_{1-2}$ and move latch plates $101_{1-2}$ from the extended to the retracted position.

When latch plates 101 and cam mechanism 103 are in the latched position, cam lobes $136_{1-2}$ are aligned with the axis of rotation of cam mechanism 103. Accordingly, any force tending to move the latch plates $101_{1-2}$ from the extended to the retracted position is transmitted along cam lobes $136_{1-2}$ through the rotational axis of cam mechanism 103 without creating any torque which would rotate cam mechanism 103 from the latched position. Thus, cam lobes $136_{1-2}$ physically maintain latch plates $101_{1-2}$ in the extended position both during the second stage of the latching operation and when the latch mechanism is in the latched orientation, preventing the latch from releasing under the application of linear impacts.

The second stage of the latching operation provides a strong clamping force to engage knife edge 118 with gasket 120 in order to effect a seal which prevents external conditions from affecting the interior region 21 of pod 18. For example, this seal prevents particulate matter and moisture from entering interior region 21. Further, this seal allows the interior region 21 to be evacuated and back-filled with an insert gas. The clamping force is approximately one (1) pound per linear inch. This clamping force is regulated by a slight bowing or spring action of latch plates $101_{1-2}$. This bowing is designed into latch plates $101_{1-2}$. Which are formed of 0.125-inch thick aluminum alloy, for example, 7075-T6.

Figure 5:
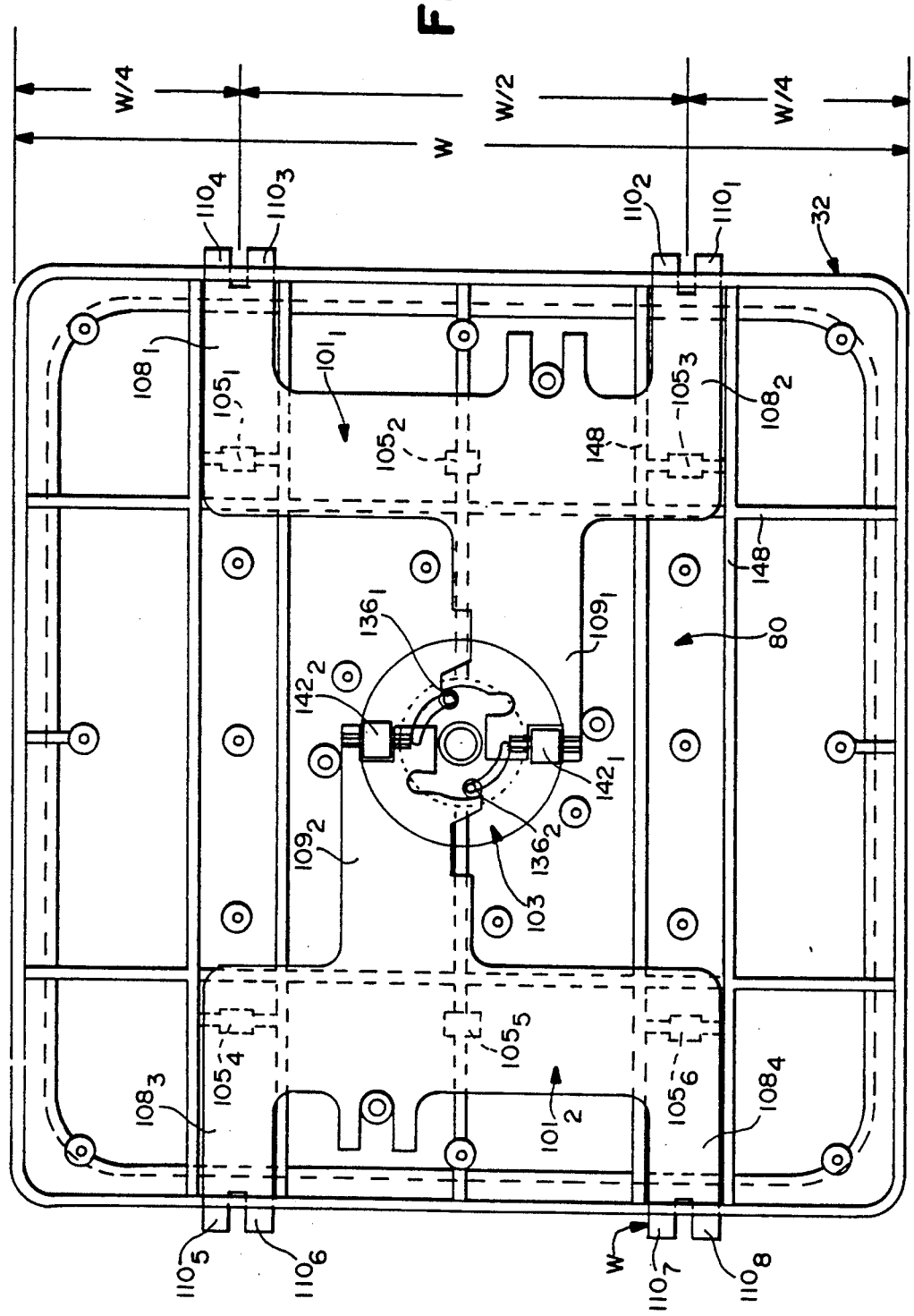
Figure 6:
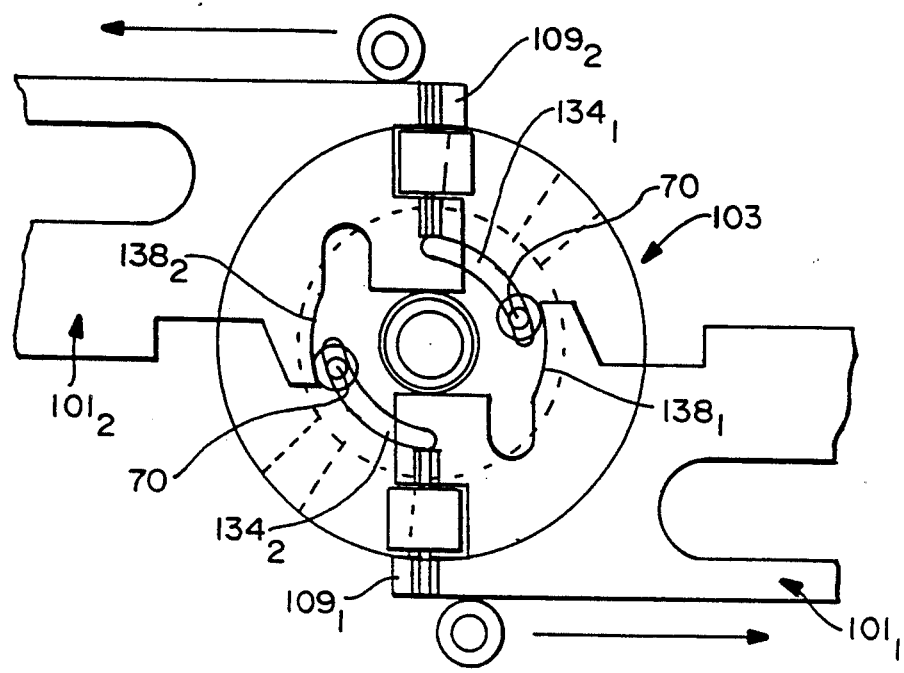
FIGS. 6 and 7 are plan views of a two-stage rotary cam of the latch mechanism in first and second positions, respectively.
Figure 7:
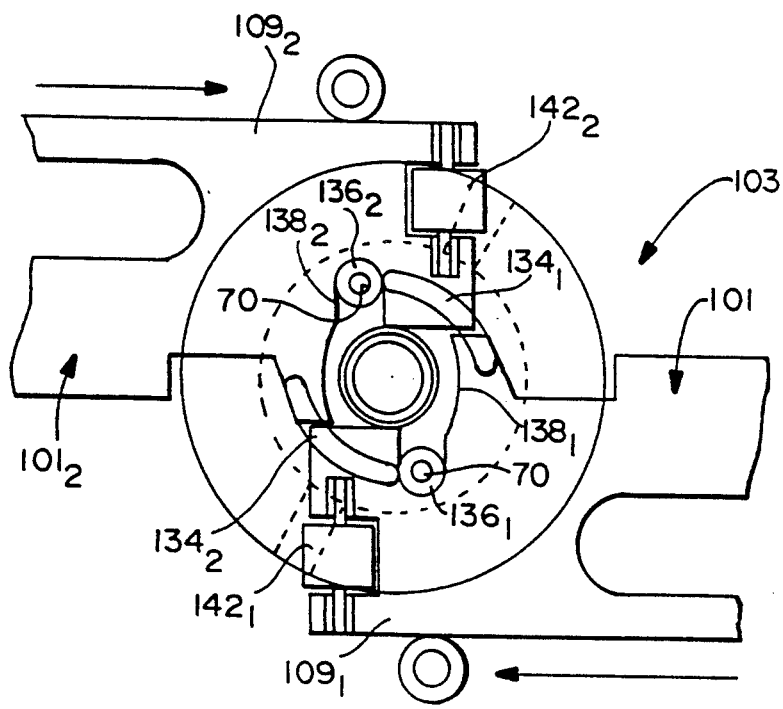
Figure 9:
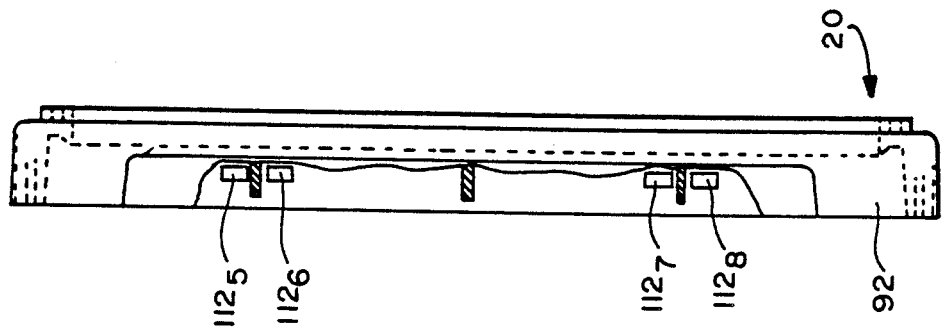
FIG. 9 is a partial cutaway side view of the interface portion shown in FIG. 8.

In order to prevent localized bending or deflection of the box door 32, due to the application of the clamping force, the clamping loads are distributed. One aspect to the distribution of the clamping force is the use of multiple latch arms $108_{1-4}$ for each latch plate $101_{1-2}$. Latch arms $108_{1-4}$ are positioned at points which are half the distance from the center to the end of the edge of the box door. As shown in FIG. 5, for a box door having a width W, latch arms are a distance approximately W/2 from each other and a distance approximately W/4 from the edge of the box door.

To strengthen the latch engaging areas of the box 20, which is usually formed of plastic, a post 113 is provided between each pair of latch engaging surfaces $112_{1-8}$. To accommodate post 113, each latch arm $108_{1-4}$ has latch fingers $110_{1-8}$ separated by a notch. Post 113 serves to decrease the unsupported length of the latch engaging surfaces $112_{1-8}$ by a factor of approximately one third and to increase the shear area by a factor of 2.

Figure 14A:
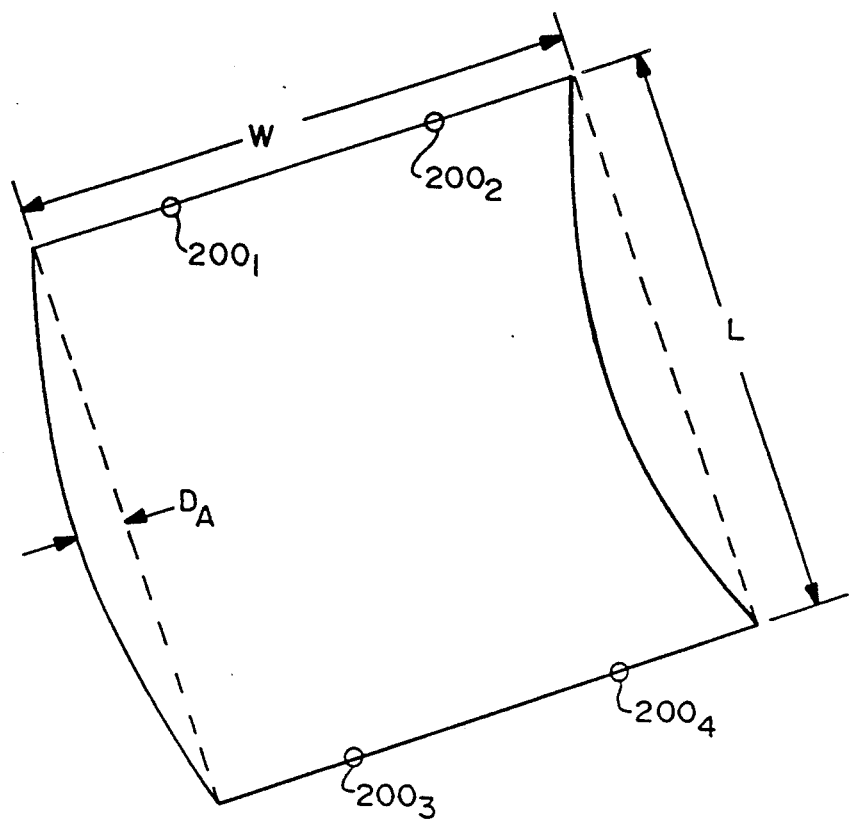
FIGS. 14A and 14B are schematic, isometric views of box doors showing different deflection patterns.
Figure 15A:
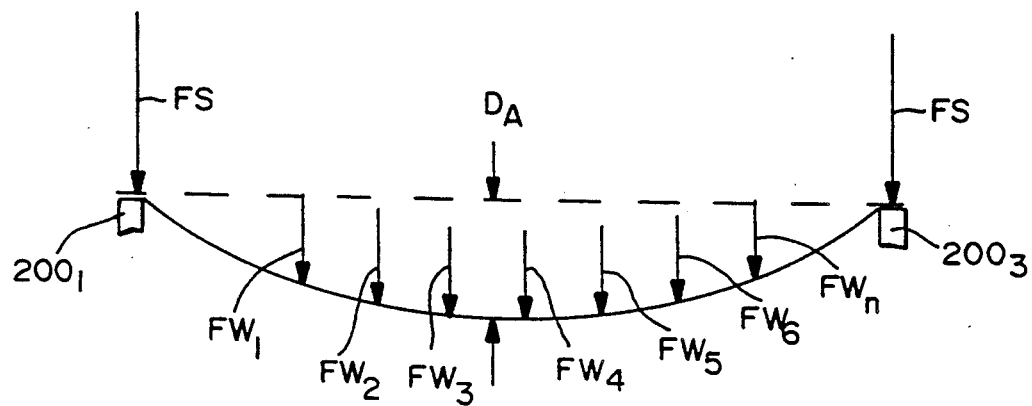
FIGS. 15A and 15B are side, isometric views of box doors showing different deflection patterns.

FIGS. 14A and 15A diagrammatically illustrate the deflection $D_A$ of a box door supported only at its edges, i.e., at support points $200_{1-4}$ and having a load ($FW_{1-n}$) created by the wafers stored in the pod uniformly distributed over the area of the box door. In addition, a sealing force FS is applied at the periphery of the box door. Any section of the box door along length L can be treated as a beam and the maximum deflection $D_A$ at the center varies with $L^3$. The deflections and stresses in loaded beams are known phenomena discussed in, for example, MACHINERY'S HANDBOOK, Obery and Jones, Industrial Press, 1963. If the amount of deflection $D_A$ is too large, the seal between the box door and the box may be broken.

Figure 14B:
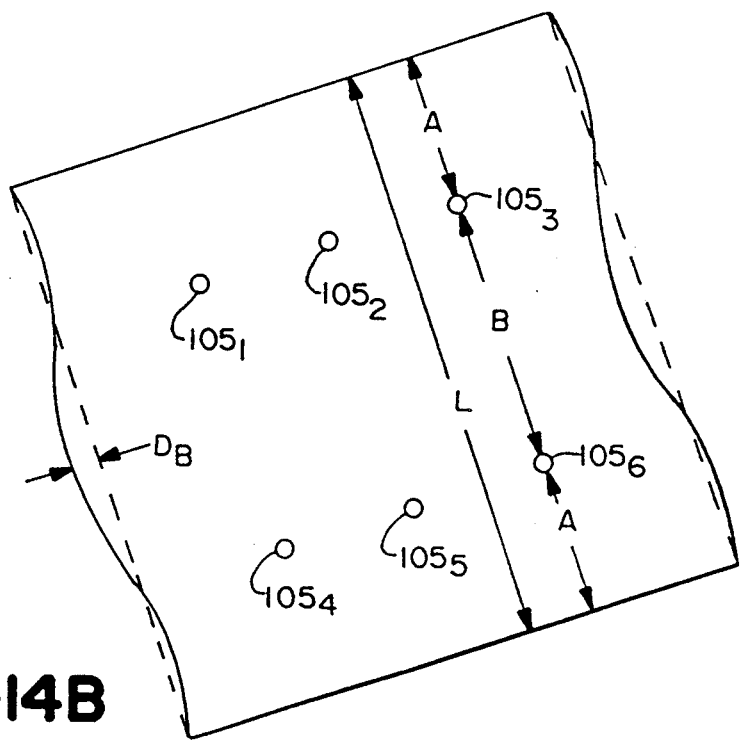
Figure 15B:
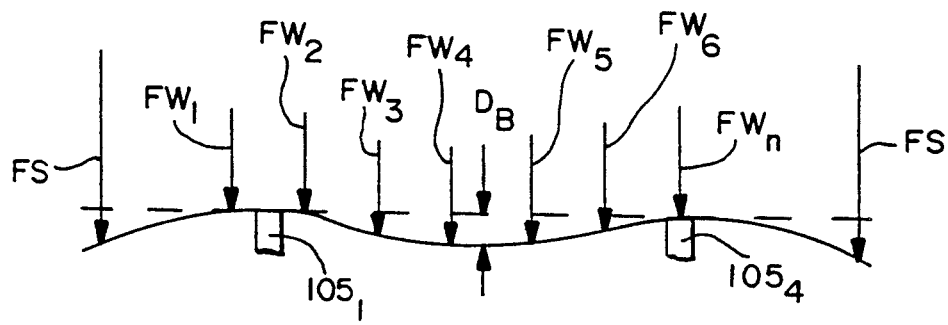

FIGS. 14B and 15B diagrammatically illustrate that the maximum deflection $D_B$ of a box door in accordance with the present invention is greatly reduced with respect to the deflection $D_A$ of a box door supported only at its edges. In the box door of the present invention, the load of the wafers (FW) and the sealing force (FS) on the box door is supported at the positions of latch plate supports $105_{1-6}$. Latch plate supports $105_{1-6}$ are located a distance A from the edge (or periphery) of the box door. Treating each section of the box door along length L as a beam, the maximum deflection $D_B$ at the center varies with $B^2 (B^2 - A^2)/L$. The application of the sealing forces FS to a cantilevered portion of the box door counters the deflection of the box door caused by the weight of the wafers. It has been determined that $D_B$ for the box door of the present invention is approximately one tenth (1/10) of $D_A$. The distribution of latch plate supports 105 along the width of box door 32 prevents deflections along the width.

The latch mechanism 80 of the present invention does not require any interruptions of the perimeter of the base of box 20, thereby removing areas of access to the "clean" environment within box 20. Further, the entire latch mechanism is contained in box door 32 which facilitates cleaning of box 20. Tampering with latch mechanism 80 is virtually eliminated, due to the fact that forces intended to move the latch plates 101 from the extended to the retracted position do not rotate cam mechanism 103 and due to the fact that cam mechanism 103 is contained within cavity 124 of box door 32 so that unauthorized access would require rotating cam mechanism 103 by inserting an implement into cam holes 132. Accordingly, access can be limited by the use of an interlock system which must be activated and/or mechanical keys Which must be inserted before rotation of cam mechanism 103 is possible.

The many features and advantages of the present invention will be apparent to those skilled in the art from the Description of the Preferred Embodiments and the Drawings. Accordingly, the following claims are intended to cover all modifications and equivalents falling within the scope of the invention.

What is claimed is:

1. A sealable, transportable container, comprising:
   a box having an interior region and a first sealing surface;
   a box door having a peripheral edge and a second sealing surface adapted to mate with said first sealing surface when said box door is moved in a sealing direction; and
   latch means for non-scraping motion in a first direction between a first position, which allows motion of said box door with respect to said box, and a second position, which limits the motion of said box door with respect to said box, and for non-scraping motion in a second direction between said second position and a third position, in which said latch means supports said box door at positions spaced from said peripheral edge of said box door to prevent said box door from deflecting, to move said box door in the sealing direction and to bring said first and second sealing surfaces into contact.

2. A sealable, transportable container, comprising:
   a box having an interior region and a first sealing surface;
   a box door having a second sealing surface adapted to mate with said first sealing surface when said box door is moved in a sealing direction; and
   latch means for:
      linear motion in a first direction between a first position, which allows motion of said box door with respect to said box, and a second position, which limits the motion of said box door with respect to said box, without scraping contact between said latch means and said box or said box door in said interior region, and,
      pivoting motion in a second direction between said second position and a third position, without scraping contact between said latch means and said box or said box door in said interior region, to move said box door in the sealing direction, to bring said first and second sealing surfaces into contact.

3. A sealable, transportable container, comprising:
   a box having a first sealing surface;

a box door having a peripheral edge and a second sealing surface adapted to mate with said first sealing surface when said box door is moved in a sealing direction;

latch means mounted on said box door for motion in a first direction between a first position, in which said latch means bypasses said box when said box door is moved with respect to said box, a second position, in which said latch means limits the motion of said box door with respect to said box, and a third position, whereby motion of said latch means from the first position to the second position occurs without sliding contact between said latch means and said box, and for motion in a second direction from the second position to a third position, in which said latch means contacts said box and supports said box door at positions spaced from said peripheral edge of said box door to prevent deflection of said box door, to move said box door in the sealing direction without sliding contact between said latch means and said box;

latch actuating means for moving said latch means from the first position to the second position and for moving said latch means from the second position to the third position.

4. A sealable, transportable container according to claim 3, wherein:

said latch means comprises first and second latch members; and said latch actuating means is centrally positioned in said box door and moves both said first and second latch members.

5. A standardized mechanical interface (SMIF) pod, comprising:

a box having an interior region, a first sealing surface, and at least two latch engaging surfaces;

a box door having a second sealing surface;

means for mating with said first and second sealing surfaces to provide a seal which isolates said interior region from ambient pressure conditions when said box door is moved in a sealing direction with respect to said box;

first and second latch members provided in said box door, each latch member having at least two box engagement portions and being movable between a disengaged position, an engaging position and an engaged-position, whereby said latch members are adapted to move from the disengaged position to the engaging position without contacting said box and whereby movement of said latch members from the engaging position to the engaged position causes said at least two box engagement portions of said latch members to contact respective ones of said at least two latch engaging surfaces without scraping said latch members against said at least two latch engaging surfaces and to move said box door in the sealing direction; and two-stage cam means centrally located in said box door for moving said latch members from the disengaged position to the engaging position in a first independent stage of operation and for moving said latch members from the engaging position to the engaged position in a second independent stage of operation.

6. A sealable, transportable container according to claim 5, wherein:

said latch members contact said box when said latch member is in the engaged position; and said latch members, when in the engaged position, support said box door at positions spaced from the periphery of said box door to prevent deflection of said box door.

7. A transportable container for maintaining the cleanliness of articles to be processed, comprising:

a box defining an interior space for containing the articles, said box having a box sealing surface and a plurality of latch surfaces;

a box door having a box door sealing surface;

means for mating with said box and box door sealing surfaces to provide a seal which isolates said interior region from ambient pressure conditions when said box door is moved in a sealing direction with respect to said box;

a plurality of latch arms corresponding to respective ones of said latch surfaces, each said latch arm having a box engaging portion and being mounted in said box door for movement, without contacting said box, between a retracted position in which each of said plurality of latch arms is entirely contained within said box door and an extended position in which said box engaging portion of each of said plurality of latch arms is adjacent to respective ones of said plurality of latch surfaces and for movement between the extended position and a latched position without scraping said plurality of latch arms against said plurality of latch surfaces;

first means for supporting said plurality of latch arms in said box door for linear and pivoting motion; and second means for moving said plurality of latch arms, in substantially linear motion in a first plane substantially parallel to said box door sealing surface, from the retracted position to the extended position and for pivoting said plurality of latch arms from the extended position to the latched position so that said box engaging portions of said plurality of latch arms move in a direction substantially perpendicular to said first plane to move said box door in said sealing direction.

8. A transportable container according to claim 7, wherein:

said plurality of latch arms comprises a first latch arm and a second latch arm;

said first means comprises first and second groups of latch arm support members provided on said box door at positions spaced from the periphery of said box door;

said first group of latch support members supports said first latch arm; and said second group of latch support members supports said second latch arm.

9. A transportable container according to claim 7, wherein said second means comprises a two stage rotary cam, having at least two first stage camming surfaces and at least two second stage camming surfaces, rotatably mounted in the center of said box door so that rotation of said cam from a first position to a second position engages respective ones of said at least two first stage camming surfaces with and moves respective ones of said latch arms from the retracted position to the extended position and so that rotation of said cam from the second position to a third position engages respective ones of said at least two second stage camming surfaces with and pivots respective ones of said latch arms from the extended position to the latch position.

10. A SMIF system for maintaining the cleanliness of articles to be processed, comprising:

a SMIF pod defining an interior space for containing the article, comprising:
  a box having first and second box top sealing surfaces, and latch surfaces,
  a box door having a box door sealing surface,
  a gasket for mating with said first box top sealing surface and said box door sealing surface to provide a seal which isolates said interior region from ambient pressure conditions when said box door is moved in a sealing direction with respect to said box,
  latch arms, each said latch arm having a box engaging portion, each said latch arm being mounted in said box door for movement, without contacting said box, between a retracted position in which said latch arms are entirely contained within said box door and an extended position in which said box engaging portion of each said latch arm is adjacent to respective ones of said latch surfaces and for movement between the extended position and a latched position,
  first means for supporting said latch arms in said box door for linear and pivoting motion, and
  second means for linearly moving said latch arms from the retracted position to the extended position and for pivoting said latch arms from the extended position to the latched position so that said box engaging portions of said latch arms move said box door in the sealing direction to make the first seal;
  a port plate having first and second port plate sealing surfaces, said first port plate sealing surface sealably mating with the second box top sealing surface for making a second seal; and
  a port door having a first port door sealing surface for sealably mating with the second port plate sealing surface for making a third seal, the port door including means for operating said second means.

11. A SMIF system according to claim 10, further comprising:
  conduit means for communicating between the interior space and an environment external to the box; and
  filter means for filtering fluids passing through the conduit means.

12. A SMIF system for maintaining the cleanliness of articles to be processed, comprising:
  a box defining an interior spaced for containing the articles, said box having first and second box top sealing surfaces and latch engaging surfaces;
  a box door having a first box door sealing surface sealably mating with the first box top sealing surfaces for making a first seal;
  box door latch means for latching the box door to the box top whereby said first seal is made and released by operation of the box door latch means, comprising:
    a latch plate, provided in said box door, having at least two box engagement portions, and being movable between a disengaged position, an engaging position and an engaged position, whereby movement of said latch plate from the engaging position to the engaged position causes said at least two box engagement portions of said latch plate to contact said latch engaging surfaces moving said box door towards said interior region of said box and forcing said first and second sealing surfaces together to form a seal isolating said interior region from ambient pressure conditions, and
    two stage cam means for moving said latch plate from the disengaged position to the engaging position without contacting said latch plate to the box in a first independent stage of operation and for moving said latch plate from the engaging position to an engaged position in a second independent stage of operation;
  conduit means for communicating between the interior space and an environment external to the box;
  filter means for filtering fluids passing through the conduit means;
  a processing station, comprising:
    a port plate having first and second port plate sealing surfaces, the first port plate sealing surface sealably mating with the second box top sealing surface for making a second seal;
    a port door having a first port door sealing surface for sealably mating with the second port plate sealing surface for making a third seal, said port door including means for activating the box door latch means; and
  means for moving fluids into and out of the box through the filtering means, the means for moving fluids being in communication with the conduit means, whereby upon activation of the fluid moving means, the interior space is alternatively evacuated or pressurized.

* * * * *